United States Patent [19]

Koishi et al.

[11] Patent Number: 4,845,720
[45] Date of Patent: Jul. 4, 1989

[54] SEMICONDUCTOR LASER CONTROL CIRCUIT

[75] Inventors: Kenji Koishi, Kawabe; Shinji Kubota, Hirakata; Kenzo Ishibashi, Moriguchi, all of Japan

[73] Assignee: Matsushita Electric Industrial Co., Ltd., Osaka, Japan

[21] Appl. No.: 262,498

[22] Filed: Oct. 18, 1988

[30] Foreign Application Priority Data

Oct. 20, 1987 [JP] Japan .................................. 62-264461
May 23, 1988 [JP] Japan .................................. 63-125265
Aug. 31, 1988 [JP] Japan .................................. 63-216560

[51] Int. Cl.$^4$ ............................................... H01S 3/13
[52] U.S. Cl. ...................................... 372/31; 250/205; 372/38
[58] Field of Search ....................... 372/38, 29, 31, 26, 372/33; 250/205; 369/44, 122

[56] References Cited

U.S. PATENT DOCUMENTS

| 4,718,068 | 1/1988 | Yoshikawa | 372/31 |
| 4,733,398 | 3/1988 | Shibagaki et al. | 372/31 |
| 4,734,914 | 3/1988 | Yoshikawa | 371/33 |
| 4,754,460 | 6/1988 | Kimura et al. | 372/38 |

Primary Examiner—James W. Davie
Attorney, Agent, or Firm—Wenderoth, Lind & Ponack

[57] ABSTRACT

Herein disclosed is a semiconductor laser control circuit in which: (i) the peak and bottom values of a pulse light can be controlled independently and precisely and set at an optical power value necessary for a high speed; and (ii) the abnormality of the output light of the semiconductor laser can be detected to prevent the stored content of an optical disc, for example, from being broken.

22 Claims, 13 Drawing Sheets

4,845,720

SEMICONDUCTOR LASER CONTROL CIRCUIT

BACKGROUND OF THE INVENTION

The present invention relates to a semiconductor laser control circuit and, more particularly, to a semiconductor laser control circuit to be used with an optical information recording/playing system for recording information in an optical disc capable of optically recording and playing it and for playing the recorded information from the optical disc.

In a certain rewrite type optical disc, one optical beam is used to accomplish the recording operation with an optical power at the peak value of a pulse light while erasing the recorded information with the bottom value of the pulse light. The recording and erasing characteristics necessary for the recording and playing operations of such rewrite type optical disc may not be obtained unless the peak and bottom values of the recording pulse light are precisely controlled. The present invention contemplates to provide a semiconductor laser circuit for independently and precisely controlling the peak and bottom values of the pulse light and for setting them at necessary optical power values at high speeds. According to the present invention, a highly reliable optical recording/playing system can be constructed by detecting an abnormality of the output light of a semiconductor laser to prevent the recorded content of the optical disc from being broken.

FIG. 12 is a circuit diagram showing the structure of a semiconductor laser control circuit according to the prior art. A semiconductor laser 1 has its output light received by an optical detector 2, the output current of which is subjected by an operation amplifier 3 to a current-voltage conversion so that it is inputted as a control error signal to a controlling operation amplifier 4. Designated at reference numeral 5 is a switch (SW) for switching such a reference voltage to a recording (R) side or a playing (P) side as is used for setting the level of the output light of the semiconductor laser 1. The operation amplifier 4 compares the reference voltage 6 or 7 and the control error signal to control the output light of the semiconductor laser to a constant level. For recording operations, the output light of the semiconductor laser 1 is subjected to a pulse modulation with a recording signal 8. This recording signal is level-shifted at 9, and the pulse amplitude value of the output light is set by a variable resistor 10. A switch 11 is turned on for the recording operations and is electrostatically coupled to the output voltage of the operation amplifier 4 by a capacitor 12. For the recording operations, therefore, the average level of the pulse-modulated output light provides the control error signal so that a control is accomplished to make the average value constant. The output light of the semiconductor laser 1 is pulse-modulated with a recording signal which is electrostatically coupled around that average value.

However, the structure described above is accompanied by a problem that the peak or bottom value of the pulse-modulated output light highly varies, when the optical-output/current characteristics of the semiconductor laser 1 change due to a temperature change or aging, so that the recording/playing characteristics of the optical disc are degraded. FIG. 13 is a diagram illustrating the optical output waveforms of the prior art for explaining that problem. FIG. 13 illustrates the relationships between the optical-output/current characteristics of the semiconductor laser 1 and the waveforms of the pulse-modulated output light. In FIG. 13, a curve $I_0$ plots the characteristics at a temperature $T_0$. In the case of recording the optical disc, it is necessary to accurately control not only the peak value $P_R$ of the pulse-modulated output light but also the bottom value $P_B$. For example, an optical disc of an unerasable material may be recorded with the optical power at the peak value $P_R$ while being preheated by the optical power at the bottom value $P_B$. Depending upon the characteristics of the material, those peak value $P_R$ and bottom value $_B$ may have to be precisely controlled. In the case of the optical disc of another erasable material, the recording operations may be accomplished with the optical power at the peak value $P_R$ while erasing with the optical power at the bottom value $P_B$. In this erasable material, too, the necessary recording and erasing characteristics may not be obtained unless the peak value $P_R$ and bottom value $P_B$ of the optical output waveforms are precisely controlled. Here, let it be assumed that the characteristics are varied $I_0 - I_1$ when the temperature of the semiconductor laser 1 is varied $T_0 - T_1$. The recording signal 8 is converted to a constant current amplitude $I_P$ and applied to the semiconductor laser 1 so that it is pulse-modulated around a control average level $P_M$. As a result, the average value at the temperature $T_1$ is so controlled that the average level $P_M$ may be constant even if the characteristics are varied to $I_1$. Since, however, the current amplitude $I_P$ of the recording signal is constant even if the curve of the optical-output/current characteristics has its gradient varied as $I_1$, the peak and bottom values of the pulse-modulated optical output are highly varied to $P_R'$ and $P_B'$, respectively. Here have been described the variations of the optical output resulting from the change $T_0 - T_1$ of the temperature characteristics. Similar degradations in the characteristics take place as $I_0 - I_1$, too, in the aging of the semiconductor laser 1.

As has been described above, as shown in FIG. 12, the structure of the prior art is troubled by a problem that the peak and bottom values of the pulse-modulated optical output are highly varied due to the temperature characteristics and aging of the semiconductor laser 1. Moreover, the optical power of the pulse-modulated optical output waveforms having such peak and bottom values cannot be measured other than its average value $P_M$ by the ordinary optical power meter, but the peak value $P_R$ and the bottom value $P_B$ have to be set by observing the waveforms. The optical power setting through those waveform measurement finds it difficult to accomplish the precise measurements. If, moreover, the current amplitude value $I_P$ is varied by the variable resistor 10, both the peak value $P_R$ and the bottom value $P_B$ are so varied that they are difficult to set independently of each other. Thus, the prior art is accompanied by the second drawback that the optical power is difficult to set.

SUMMARY OF THE INVENTION

It is, therefore, an object of the present invention to provide a semiconductor laser control circuit which is enabled, even if the output-light/current characteristics are changed due to the temperature characteristics and aging of a semiconductor laser, to control the peak and bottom values of pulse-modulated optical output waveforms to a constant optical power level and to precisely set the peak and bottom values of the pulse-modulated optical output waveforms by using an ordinary optical power meter.

In order to achieve the above-specified object, according to the present invention, there is provided a semiconductor laser control circuit which comprises: first closed-loop control means made receptive of the output light of a semiconductor laser for controlling an optical power control error signal to a first optical power value; first open-loop control means for sample-holding the control voltage of said first closed loop to control the held voltage to said first optical power value; second closed-loop control means for controlling the same to a second optical power value; second open-loop control means for sample-holding the control voltage of said second closed loop to control the held voltage to a second optical power value; and optical pulse modulating means for optical pulse modulations of the first optical power value, which is controlled by said first open-loop control means, to the bottom value of an optical pulse waveform and the second optical power value, which is controlled by said second open-loop control means, to the peak value of an optical pulse waveform.

With the structure described above according to the present invention, the first and second optical power values are precisely controlled independently of each other by the closed-loop control means. During the pulse modulations, moreover, the first and second optical power values, which are controlled by the closed-loop control means, are maintained independently of each other with the first and second held control voltages by the open-loop control means. The first optical power value gives the bottom value of the optical pulse waveform whereas the second optical power value gives the peak value of the optical pulse waveform. As a result, the peak and bottom values of the optical pulse waveform can be set independently of each other. Thus, before the optical output of the semiconductor laser is pulse-modulated, a DC emission is accomplished with optical powers corresponding to the peak and bottom values of the optical pulse waveform, and a precise control is made to a set optical power by the closed-loop control means. Thus, even if the optical-output-/current characteristics of the semiconductor laser are varied with the temperature characteristics and the aging, the peak and bottom values of the optical pulse waveform can be controlled independently and precisely. Since, moreover, the peak and bottom values of the optical pulse waveform are directly sample-held but not subjected to the optical power control, the optical power control accuracy is not degraded even for a high modulation frequency. Still moreover, the optical power values corresponding to the peak and bottom values can be measured with the DC light before the optical pulse modulations. Thus, even if an expensive optical power meter for the pulse light is not used, the peak and bottom values of the optical pulse waveform can be precisely measured with the ordinary optical power meter for the DC light.

Another object of the present invention is to provide a semiconductor laser control circuit which can switch the optical output of a semiconductor laser fast and stably from high to low powers or vice versa.

In order to achieve this object, according to the present invention, there is provided a semiconductor laser control circuit which comprises: optical power control error voltage generating means made receptive of the output of a semiconductor laser for converting the optical power to a voltage; reference voltage generating means for setting the output light of said semiconductor laser at a desired level; a servo-amplifier for generating a control voltage by comparing said optical power control error voltage and a reference voltage; a current source for feeding an electric current to said semiconductor laser in accordance with the control voltage of said servo-amplifier; sample hold means connected between said servo-amplifier and said current source for driving said current source with the control voltage of said servo-amplifier during a sampling section to accomplish the closed-loop control of the output light of said semiconductor laser and for holding the control voltage of said servo-amplifier during a holding section to accomplish the closed loop of the output light of said semiconductor laser; switch means for opening or substantially opening the input of said servo-amplifier and said monitor voltage generating means during said holding section or until the sampling section of said closed-loop control begins; switch means for shorting or substantially shorting monitor voltage generating means at the input of said servo-amplifier and said reference voltage generating means; and control means for preventing the control voltage generated by said servo-amplifier from being saturated by the use of said switch means.

With the structure thus far described according to the present invention, not only the connection between the input of the servo-amplifier and the monitor voltage generating means but also the connection between the input of the servo-amplifier and the reference voltage generating means is opened or substantially opened by the switch means during the holding section or until the sampling section of the closed-loop control begins. As a result, the control voltage generated by the servo-amplifier is not saturated by the power source voltage but is varied fast and smoothly, when the sampling section of the closed-loop control begins, so that the optical output of the semiconductor laser is switched fast and stably from the high to low powers or vice versa.

Other objects of the present invention are to detect a normal emission level or an abnormal emission level accurately even in a DC emission mode and in a pulse modulation mode in which the optical pulse waveform takes a peak or bottom value and to provide a semiconductor laser control circuit for protecting the recorded content of an optical disc and the semiconductor laser itself when the semiconductor laser is troubled.

In order to achieve the above-specified objects, in one semiconductor laser control circuit according to the present invention, the reference voltage to be compared with the optical power monitor voltage and the reference voltage for setting the peak and bottom values of the pulse waveform are arithmetically processed in the pulse modulation mode. In another semiconductor laser control circuit, on the other hand, there is generated a voltage value between the reference voltage for setting the DC emission level and the reference voltage for setting the bottom value. In the DC emission mode, not only the voltage value between the DC emission level and the bottom value but also a voltage value between non-emission and emission status is specified as the reference voltage. A comparison output is also generated for detecting a current value lower than a predetermined level only in the DC emission mode. Irrespective of the emission mode, moreover, the comparison voltage is set in the vicinity of the maximum allowable optical output of the semiconductor laser to prevent the breakage.

Thus, in the present invention, the timing or section for checking the emission status is specified so that the detections are accomplished only in the section excepting the transitional status of the optical power control to be generated when in the switching operation to each mode. Furthermore, the check of the DC emission level is accomplished at a predetermined timing after the emission is ON, whereas the check of the peak value is accomplished at a predetermined timing in the sampling control section before the pulse modulations are not begun in the pulse modulation mode. An abnormal emission is detected with the comparison voltage and timing described above to control the semiconductor laser from the emission to non-emission status thereby to protect the semiconductor laser.

In the pulse modulation mode, moreover, the emission level of the peak value of the pulse waveform can be checked more reliably by processing and comparing the reference voltage for actually setting the optical output than by merely comparing it with a fixed voltage. An erroneous detection can also be prevented by accomplishing the check at a predetermined timing within the sampling control section in which the pulse modulations are not begun yet. On the other hand, the emission level of the bottom value can be checked highly reliably while preventing the erroneous detection by setting the comparison voltage at a value between the DC emission level and the reference voltage of the bottom value and by restricting the checking section within a section excepting the transitional status of the optical power control, which occurs when the emission mode is switched. The semiconductor laser can be prevented without fail from any breakage by making a comparison with a voltage value between the bottom value and the reference voltage at the DC emission level in the DC emission mode, by making a comparison with a current value in the vicinity of that flowing during the DC emission to prevent such an abnormal emission as will erroneously record or erase the recorded content of the optical disc, and by accomplishing the detection of the excessive current of the semiconductor laser at a low optical power value during the DC emission. Still moreover, the semiconductor laser is prevented from being broken by the excessive power, by setting the comparison level in the vicinity of the maximum allowable optical output of the semiconductor laser and by making the comparison irrespective of the emission mode.

While the novel features of the present invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
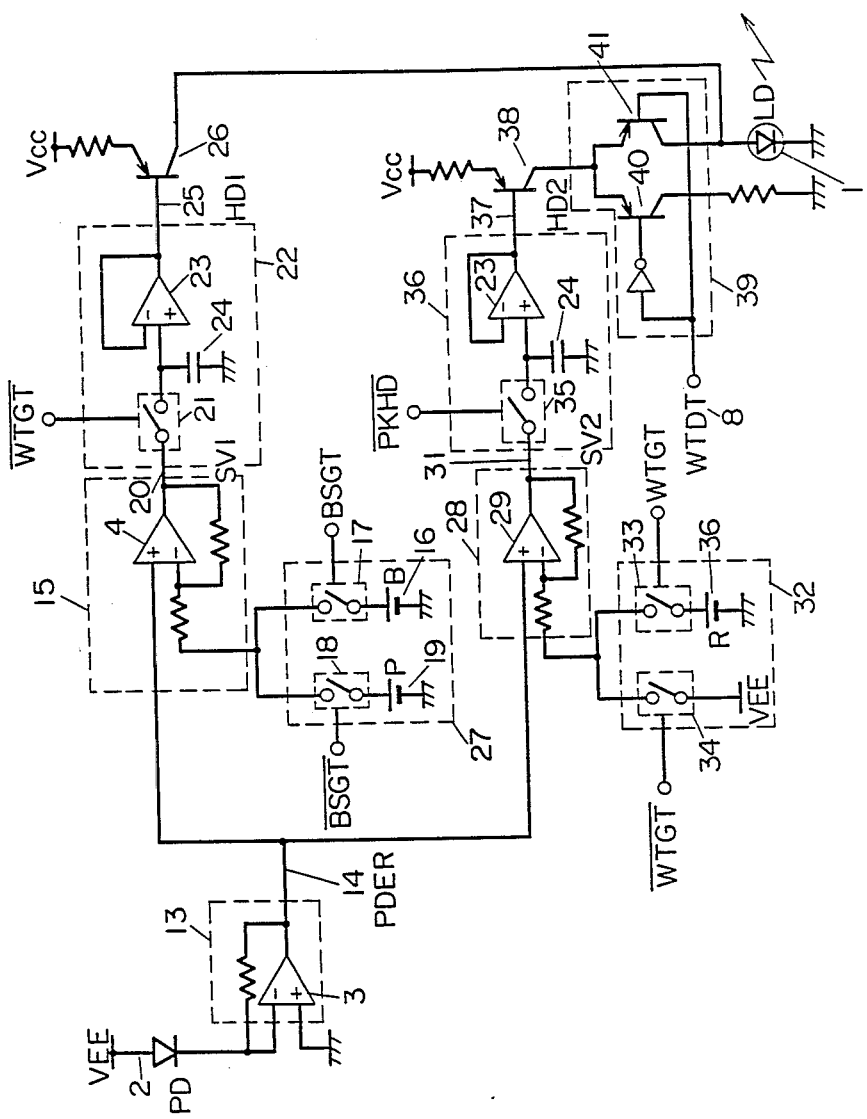
FIG. 1 is a diagram showing the structure of the semiconductor laser control circuit according to a first embodiment of the present invention.

FIG. 1 is a diagram showing the structure of the semiconductor laser control circuit according to the first embodiment of the present invention. A semiconductor laser 1 has its output light received by an optical detector 2, and this received current is converted to a voltage by an operation amplifier 3. This amplifier 3 has its output providing an optical power control error voltage 14. Designated at reference numeral 13 is optical power control error voltage generating means. Numeral 15 designates first closed-loop control means for controlling the output light of the semiconductor laser to a first optical power value, i.e., the bottom value of an optical pulse waveform when pulse modulations are accomplished. The first closed-loop control means 15 is composed of an operation amplifier 4 for comparing the optical power control error voltage (PDER) 14 and a first reference voltage 16. Numeral 27 designates first reference voltage generating means. Numeral 17 designates a switch which is turned on when the closed-loop control means 15 is controlled to the first optical power value. A switch 18 is turned on when the closed-loop control means is not set for power at the pulse modulations, i.e., when in the play of an optical recording/playing apparatus, to switch the first reference voltage to a reference voltage 19 for the play. Since it is sufficient for the play that the semiconductor laser is subjected to a DC emission, the control means 15 maintains its closed-loop control. Reference letters BSGT designate a bias gate which takes an H level for the period other than that for the play to turn on the switch 17 and off the switch 18. A first control voltage 20 outputted from the first closed-loop control means 15 switches the optical power control of the first closed-loop control means to the setting of the first optical power value from the playing operation to turn off a switch 21 at the instant when the optical power control is stabilized. Numeral 22 designates first sample hold means for holding the first control voltage value, which is inputted from a operation amplifier 23 and a capacitor 24, to output a first hold voltage 25. If the switch 21 is turned off, the control means 15 interrupts the closed-loop control so that the output light of the semiconductor laser 1 is subjected to the closed-loop control by the first hold voltage 25 and held at the first optical power value. A transistor 26 has its base fed with the control voltage or hold voltage to drive the semiconductor laser with an electric current. Letters WTGT designate a write gate which takes the H level, at the instant when the optical power control of the first closed-loop control means 15 is stabilized, to turn off the switch 21 thereby to hold the first control voltage. Numeral 28 designates second closed-loop control means. An operation amplifier 29 compares the optical power control error voltage 14 and a second reference voltage 30 to output a second control voltage 31. The second closed-loop control means makes a control to a second optical power value, i.e., an optical power corresponding to the peak value of the optical pulse waveform at the pulse modulations. Numeral 32 designates second reference voltage generating means having its switch 33 turned on and its switch 34 turned off, when the write gate WTGT takes the H level, to generate the second reference voltage 30 for setting the second optical power value. When the optical power control by the second closed-loop control means is stabilized, a peak hold gate PKHD is given the high level to turn off a switch 35. As a result, second sample hold means 36 holds the second control voltage 31 to output a second hold voltage 37. When the peak hold gate takes the H level, the control means 28 interrupts the closed loop control so that the output light of the semiconductor laser 1 is subjected to the closed loop control by the second hold voltage 37 and held at the second optical power value. Numeral 38 designates a transistor which is energized by the second control voltage or the second hold voltage to drive the semiconductor laser with an electric current. Numeral 39 designates optical pulse modulating means. In the open-loop control status in which the transistors 26 and 28 are driven by the first and second hold voltages, a modulation signal is inputted to the write data WTDT. Transistors 40 and 41 accomplish the differential switching operations in accordance with the write data 8 to turn on and off the current flowing through the transistor 38 in response to the modulation signal. As a result, the electric current driven by the transistor 26 always flows through the semiconductor laser 1 to turn on and off the electric current to be driven by the transistor 38. In other words, during the pulse modulations, the pulse waveform has its bottom value controlled to the first optical power value and its peak value controlled to the second optical power value.

Figure 2:
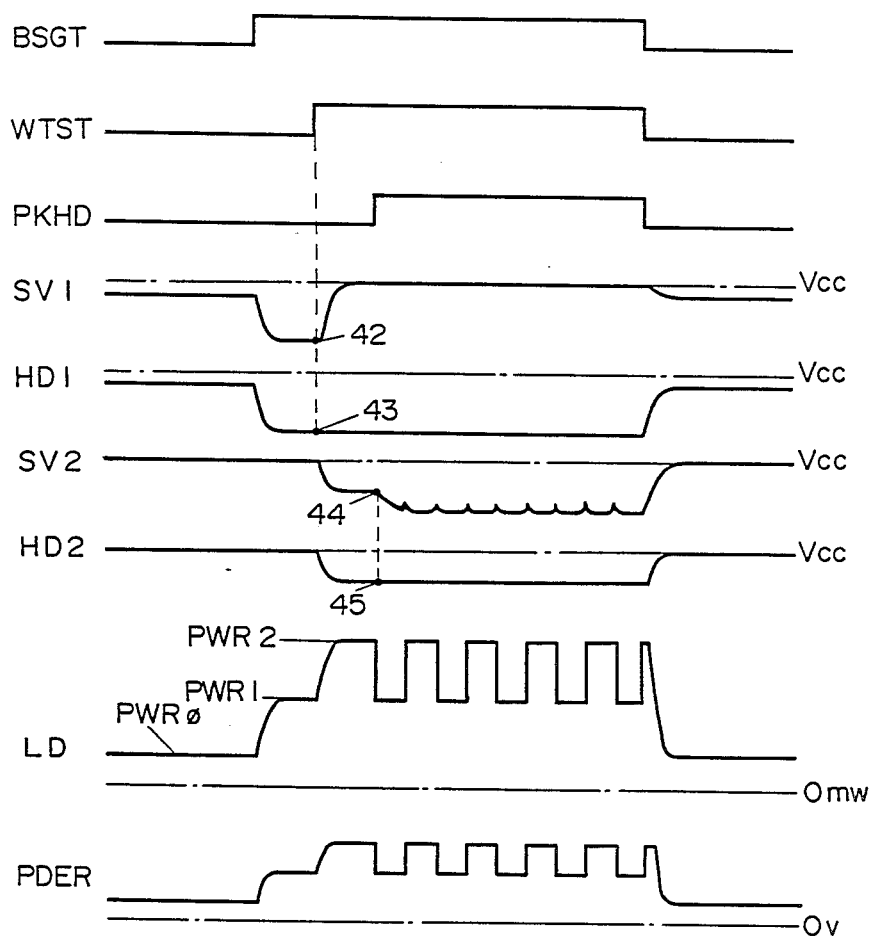
FIG. 2 is a waveform chart of the same embodiment.

FIG. 2 is a waveform chart showing the operations of the structure of FIG. 1. The bias gate BSGT is at the H level from the playing operation to the end of the series power setting and the pulse modulations. The time period from the rise of the bias gate BSGT to the break of the write gate WTGT is a section for which the first closed-loop control means 15 for setting the first optical power value, i.e., the bottom value of the optical pulse waveform is operating. The time period from the rise of the write gate WTGT to the rise of the peak hold gate PKHD is the section for which the second closed-loop control means 28 for setting the second optical power value, i.e., the peak value of the optical pulse waveform is operating. Letters SV1 designate the waveform of the first control voltage 20, and letters SV2 designate the waveform of the second control voltage 31. Letters SV2 designate the waveform of the second control voltage 31, and letters HD1 designate the waveform of the first peak hold voltage 25 whereas letters HD2 designate the waveform of the second peak hold voltage 37. Letters LD designate the waveform of the optical output of the semiconductor laser 1. Letters PWR0 designate the level of a play power; letters PWR1 designate the level of the bottom value of the optical pulse waveform; and letters PWR2 designate the level of the peak value of the optical pulse waveform. Letters PDER designate the optical power control error voltage 14 which is obtained by the light received by the optical detector 2. At an instant 42 when the first closed loop control operates to stabilize the optical power control, as indicated at SV1, the write gate WTGT is raised to the H level to hold the first control voltage (as indicated at 43). The voltage thus held is maintained until the next play after the pulse modulations. Next, at an instant 44 when the second closed loop control means operates, as indicated at SV2, at the timing of turning on the WTGT so that the optical power control is stabilized, the peak hold gate PKHD is raised to the H level to hold the second control voltage (as at 45). The voltage thus held is maintained until the next play after the pulse modulations. The output light of the semiconductor laser 1 is subjected during the first and second closed-loop control sections, as shown in FIG. 2, to independent closed-loop controls in the DC emission status. In the pulse modulation section, on the other hand, the pulse modulations are accomplished between the levels of the first and second optical power values with the first and second control voltages being held.

As has been described hereinbefore, according to the present embodiment, before the pulse modulations of the optical output of the semiconductor laser, the DC emission is accomplished with the optical powers corresponding to the peak and bottom values of the optical pulse waveform to precisely control the set optical power with the closed-loop control means. Next, the control voltage thus obtained by the closed-loop control means is held for the pulse modulations. Thus, even if the optical-output/current characteristics of the semiconductor laser are varied due to the temperature characteristics and aging, the peak and bottom values of the optical pulse waveform can be controlled independently and precisely. Moreover, the optical power can be precisely controlled irrespective of the modulation frequency of the optical pulse waveform.

As has been described above, according to the present invention, even if the optical-output/current characteristics of the semiconductor laser are varied due to the temperature characteristics and aging, the peak and bottom values of the optical pulse waveform can be controlled independently and precisely. Since, moreover, the peak and bottom values of the optical pulse waveform are directly sample-held but without any optical power control, the optical power control accuracy will not be degraded even for a high modulation frequency. Before the optical pulse modulations, the optical power values corresponding to the peak and bottom values of the optical pulse waveform can be measured with the DC light. Thus, the peak and bottom values of the optical pulse waveform can be precisely measured with an ordinary optical power meter for the DC light even if any expensive optical power meter for the pulse light is not used.

A second embodiment of the present invention will be described in the following with reference to the accompanying drawings.

Figure 3:
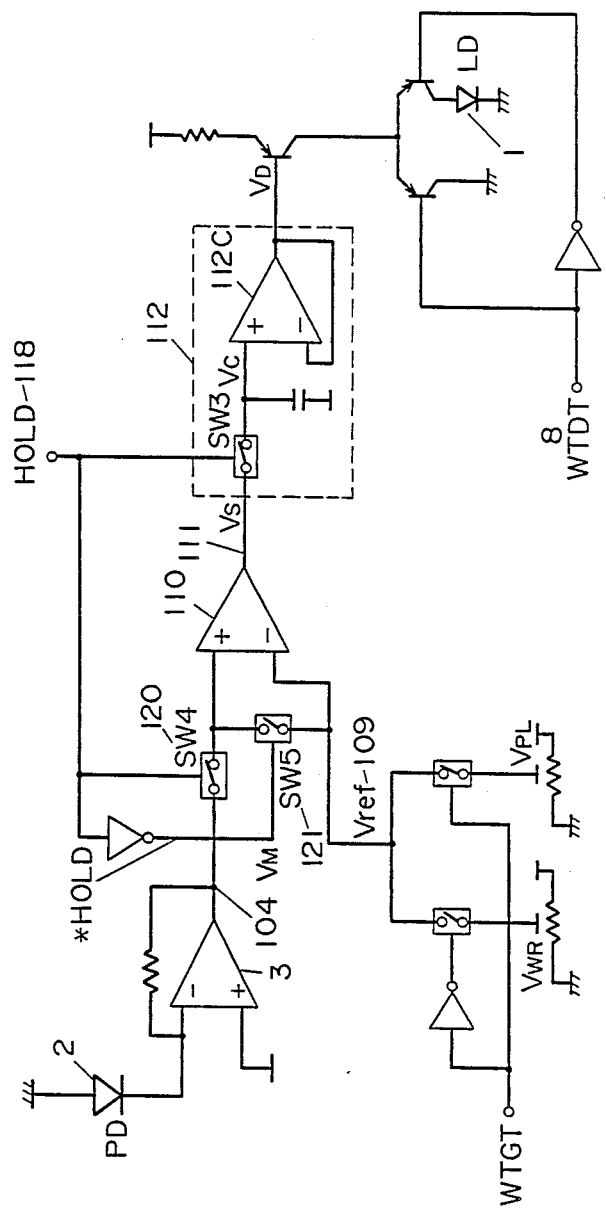
FIG. 3 is a diagram showing the structure of the semiconductor laser control circuit according to a second embodiment of the present invention.
Figure 4:
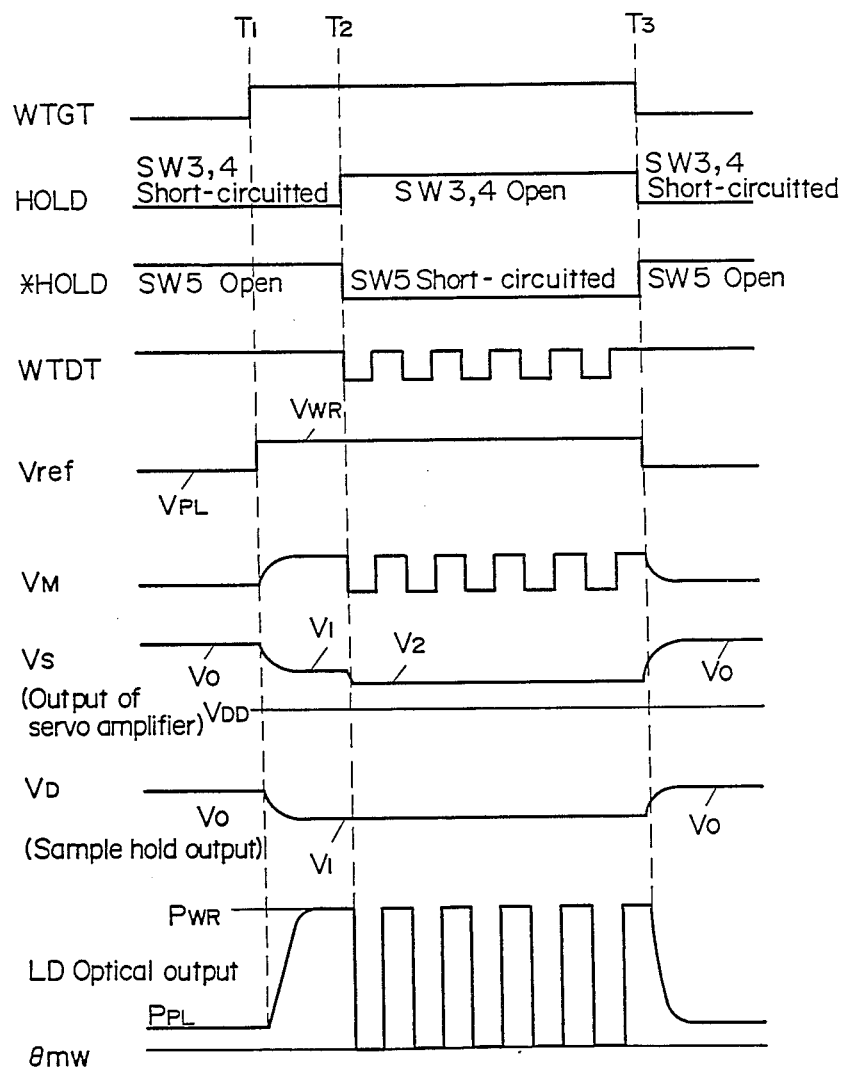
FIG. 4 is a waveform chart for explaining the operations of the same embodiment.

FIG. 3 is a diagram showing the structure of the semiconductor laser control circuit according to the second embodiment of the present invention. FIG. 4 is a time chart for explaining the operations of the same circuit. This second embodiment is directed to an invention for preventing the outputs of the operations amplifiers 4 and 29 of the first embodiment from being saturated. For simplicity of discussion, the circuit structure around only one operation amplifier will be described in the following.

Under the control of hold signal HOLD 118, a switch SW4 120 opens a monitor voltage $V_M$ 104 and the input of a servo-amplifier 110 during the hold section of a closed-loop control and closes the monitor voltage $V_M$ and the input of the servo-amplifier 110 during the sampling period of the closed-loop control.

Under the control of a signal *HOLD having the polarity opposite to that of the hold signal HOLD 118, a switch SW5 121 closes the monitor voltage $V_M$ and a reference voltage $V_{ref}$ (109) during the holding period of the closed-loop control and opens the monitor voltage $V_M$ and the reference voltage $V_{ref}$ during the sampling period of the closed loop control.

By the controls of those two switches SW4 and SW5, the servo-amplifier 110 has its positive input or the monitor voltage $V_M$ opened but its negative input or the reference voltage $V_{ref}$ closed during the holding section. As a result, the positive and negative inputs become equal so that the servo-amplifier 110 can be prevented from having its output $V_S$ from being saturated to the power source voltage.

Next, the operations of the circuit of FIG. 3 will be described with reference to FIG. 4.

When the write gate WTGT takes the H level for the recording status at a time $T_1$, the optical output of the semiconductor laser is kept under the closed-loop control, but the reference voltage $V_{ref}$ is switched from $V_{PL}$ (for the playing operations) to $V_{ER}$ (for the writing operations).

The aforementioned servo-amplifier 110 subjects the control voltage $V_S$ to the closed-loop control to equalize the monitor voltage $V_M$ to the value $V_{WR}$ of the reference voltage $V_{ref}$ of one input thereby to raise the optical output of the semiconductor laser from the play power $P_{PL}$ to the write power $P_{WR}$.

When the optical output of the semiconductor laser is stabilized with the write power $P_{WR}$ by the closed-loop control, the hold signal HOLD takes the H level at a time $T_2$ to open a switch SW3 so that the sample hold circuit 112 holds the value $V_1$ of the control voltage $V_S$ at that time.

At the same time $T_2$, the switch SW4 is opened by the similar hold signal HOLD of the switch SW3, but the switch SW5 is closed by the opposite-polarity signal *HOLD of the hold signal HOLD.

Because these positive and negative inputs are equal, the control voltage $V_S$ or the output of the servo-amplifier 110 takes at such a voltage level $V_2$ during the hold period from $T_2$ to $T_3$ as will not be saturated to a power source voltage $V_{DD}$.

At the timing $T_3$, the hold section is terminated and switched from the writing to playing operations. Then, the switches SW3 and SW4 are closed, but the switch SW5 is opened so that the output of the servo-amplifier 110 and the input of a buffer 112C of the sample hold circuit 112 are connected to cause the closed-loop control. At this time, the control voltage $V_S$ or the output of the servo-amplifier 110 takes the level $V_2$ unsaturated with the power source voltage $V_{DD}$ and has a small voltage difference from the input voltage $V_1$ of the sample hold circuit 112 so that it is smoothly connected. As a result, the control voltage $V_D$ of the output of the sample hold circuit 112 is raised fast and stably from the level $V_1$ of the write power to the level $V_0$ of the play power, as shown in FIG. 4.

In response to this variation of the control voltage $V_D$, the optical output of the semiconductor laser is switched fast and stably without generating any abnormal power at the timing $T_3$ of switching the writing to playing operations, as shown in FIG. 4.

As has been described hereinbefore, according to the present embodiment, thanks to both the switch means for opening or substantially opening the input of the servo-amplifier and the monitor voltage generating means during the holding section and the switch means for shorting or substantially shorting the monitor voltage generating means of the input of the servo-amplifier and the reference voltage generating means, the control voltage of the output of the servo-amplifier is not saturated with the power source voltage, and the control voltage is varied fast and smoothly, when the holding section is switched to the sampling section of the closed-loop control, so that the optical output of the semiconductor laser can be switched fast and stably from the writing to playing operations.

Figure 5:
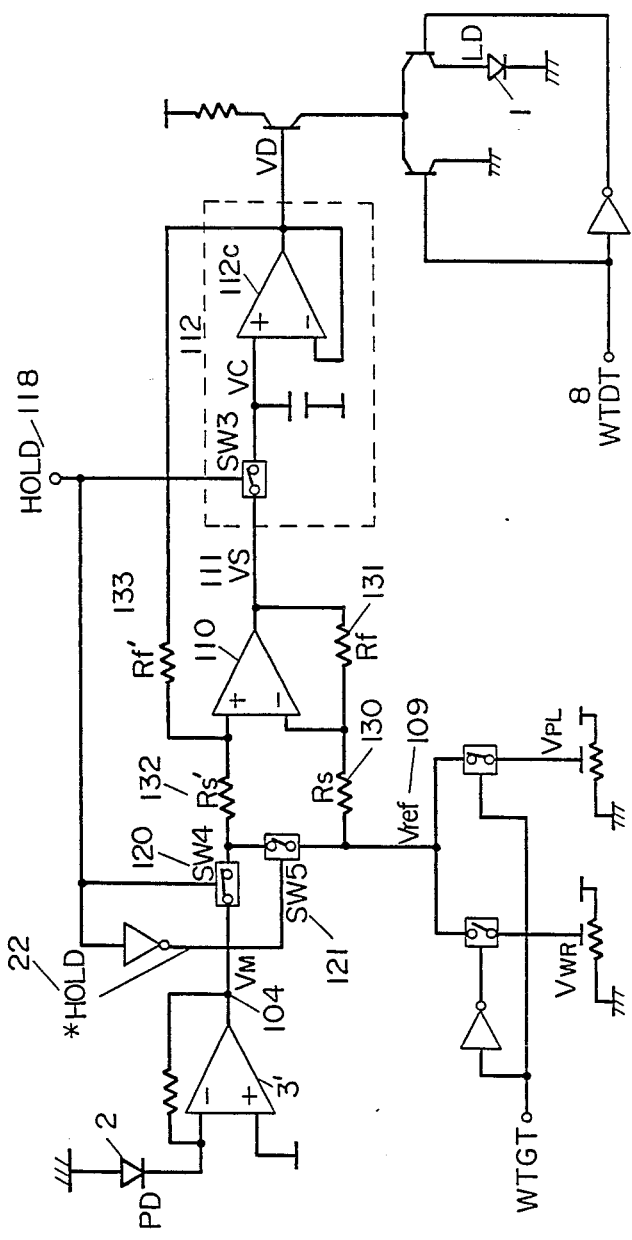
FIG. 5 is a diagram showing the structure of the semiconductor laser control circuit according to a third embodiment of the present invention.
Figure 6:
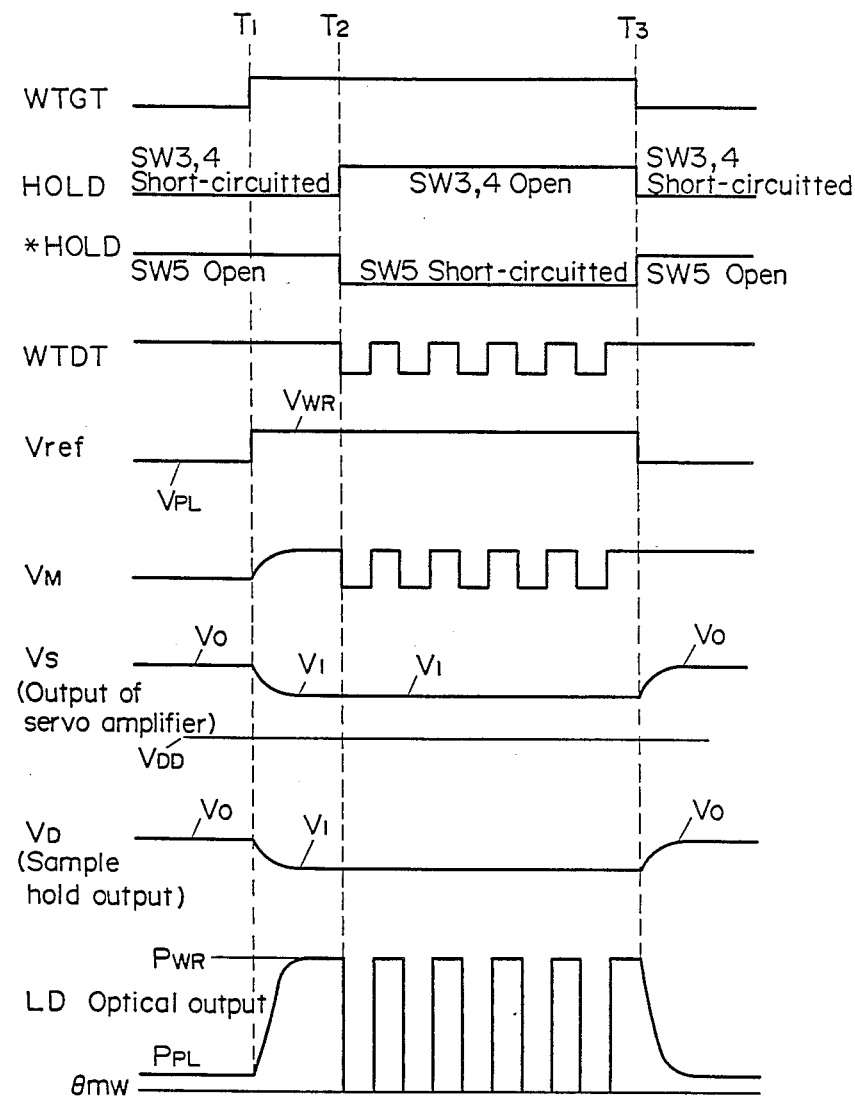
FIG. 6 is a waveform chart of the same embodiment.

FIG. 5 is a diagram showing the structure of the semiconductor laser control circuit according to the third embodiment of the present invention. FIG. 6 is a timing chart for explaining the operations of the same circuit.

With reference to FIG. 5, a first description is directed to the portions added to the circuit of the second embodiment of FIG. 3. Four resistors, i.e., an input resistor Rs 130, a feedback resistor Rf 131, an input resistor Rs' 132 and a feedback resistor Rf' 133 are used to operate the aforementioned servo-amplifier 110 as a differential amplifier. The resistor Rf' 133 feeds back the output $V_D$ of a sample hold circuit 112 to the output of the servo-amplifier 110 during the holding section so that the output $V_D$ of the circuit 112 may be generated.

Those four resistors Rs, Rf, Rs' and Rf' are so related to equalize the gains of the negative input $V_M$ and the negative input $V_{ref}$ of the differential amplifier of the servo-amplifier 110 as to satisfy $Rf/Rs = Rf'/Rs'$. With this relation, the output $V_S$ of the servo-amplifier 110 is expressed by $V_D = (Rf/Rs)(V_M - V_{ref}) + V_D$ by using the input voltages $V_M$ and $V_{ref}$ and the output $V_D$ of the sample hold circuit 112.

Here, during the holding section, the switches SW3 and SW4 are opened whereas the switch SW5 is closed so that the reference voltage $V_{ref}$ is fed equally to the positive and negative inputs of the servo-amplifier 110. Thus, the output of the servo-amplifier 110 takes the value $V_S = (Rf/Rs)(V_M - V_{ref}) + V_D = V_D$ so that the output $V_D$ of the sample hold circuit 112 is generated. As a result, the output $V_S$ of the servo-amplifier 110 is not saturated with the power source voltage but takes the value $V_D$ substantially equal to the hold voltage $V_C$ of the sample hold circuit 112. When the sampling section of the closed-loop control is switched from the holding section, the switch SW3 is closed to match the control voltage $V_S$ and the hold voltage $V_C$ so that the optical output of the semiconductor laser is switched fast and stably from the writing to playing operations.

Next, the operations of the circuit of FIG. 5 will be described with reference to FIG. 6.

When the write gate WTGT comes into its writing status at the time $T_1$, the reference voltage $V_{ref}$ is switched from $V_{PL}$ (for the playing operations) to $V_{WR}$ (for the writing operations) while being left under the closed loop control.

The aforementioned servo-amplifier 110 subjects the control voltage $V_S$ to the closed-loop control so that the monitor voltage $V_M$ may become equal to the value $V_{MR}$ of the reference voltage $V_{ref}$ of one input, thereby to raise the optical output of the semiconductor laser from the play power $P_{PL}$ to the write power $P_{WR}$.

When the optical output of the semiconductor laser is stabilized to the write power $P_{WR}$ by the closed-loop control, the hold signal HOLD takes the H level at the time $T_2$ to open the switch SW3 so that the sample hold circuit 112 holds the value $V_1$ of the control voltage $V_S$ at that time.

Simultaneously with this, the switch SW4 is opened whereas the switch SW5 is closed so that the reference voltage $V_{ref}$ of the negative input is equally applied to the positive and negative inputs of the servo-amplifier 110. As a result, the value $V_1$ of the output $V_D$ of the sample hold circuit 112, which has been fed back by the resistor Rf 133, is substantially equally generated as the output of the differential amplifier.

When the holding section is terminated at the timing $T_3$ to switch from the write mode to the play mode, the switches SW3 and SW4 are closed whereas the switch SW5 is opened to connect the output of the servo-amplifier 110 and the input of the sample hold circuit 112, thus inviting the closed-loop control. At this time, the control voltage $V_S$ or the output of the servo-amplifier 110 is at substantially the same level as the voltage $V_1$ held in the sample hold circuit 112 so that the connection is smoothly accomplished. As a result, the control voltage $V_D$ of the output of the sample hold circuit 112 rises fast and stably from the level $V_1$ of the write power to the level $V_0$ of the play power, as shown in FIG. 6.

In response to this variation of the control voltage $V_D$, the optical output of the semiconductor laser is switched fast and stably without generating any abnormal power at the timing $T_3$ from the writing to playing operations, as shown in FIG. 6.

As has been described hereinbefore, according to the present embodiment, the output of the sample hold circuit is fed back through the resistors to the servo-amplifier input of the differential amplifier and generated at the output of the servo-amplifier to substantially equalize the hold voltage and the control voltage or the output of the servo-amplifier. When the section is switched from the holding section to the sampling section of the closed-loop control, the control voltage is varied fast and smoothly so that the optical output of the semiconductor laser can be switched fast and stably from the writing to playing modes.

Figure 7:
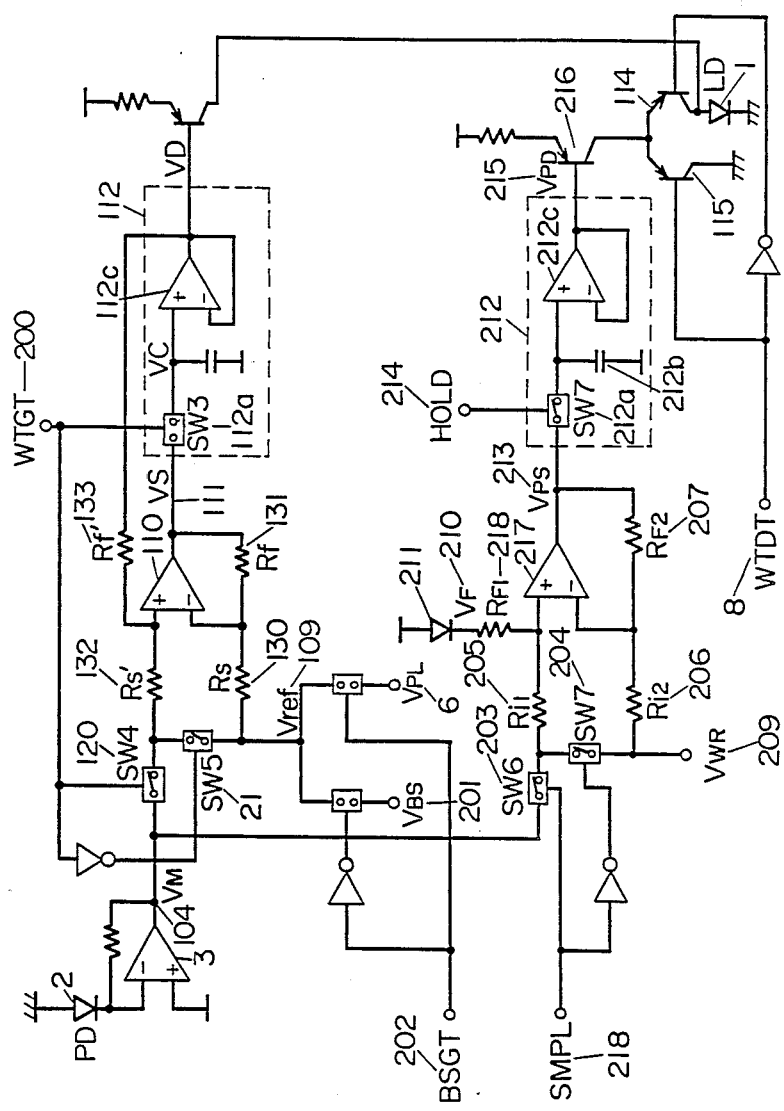
FIG. 7 is a diagram showing the structure of the semiconductor laser control circuit according to a fourth embodiment of the present invention.
Figure 8:
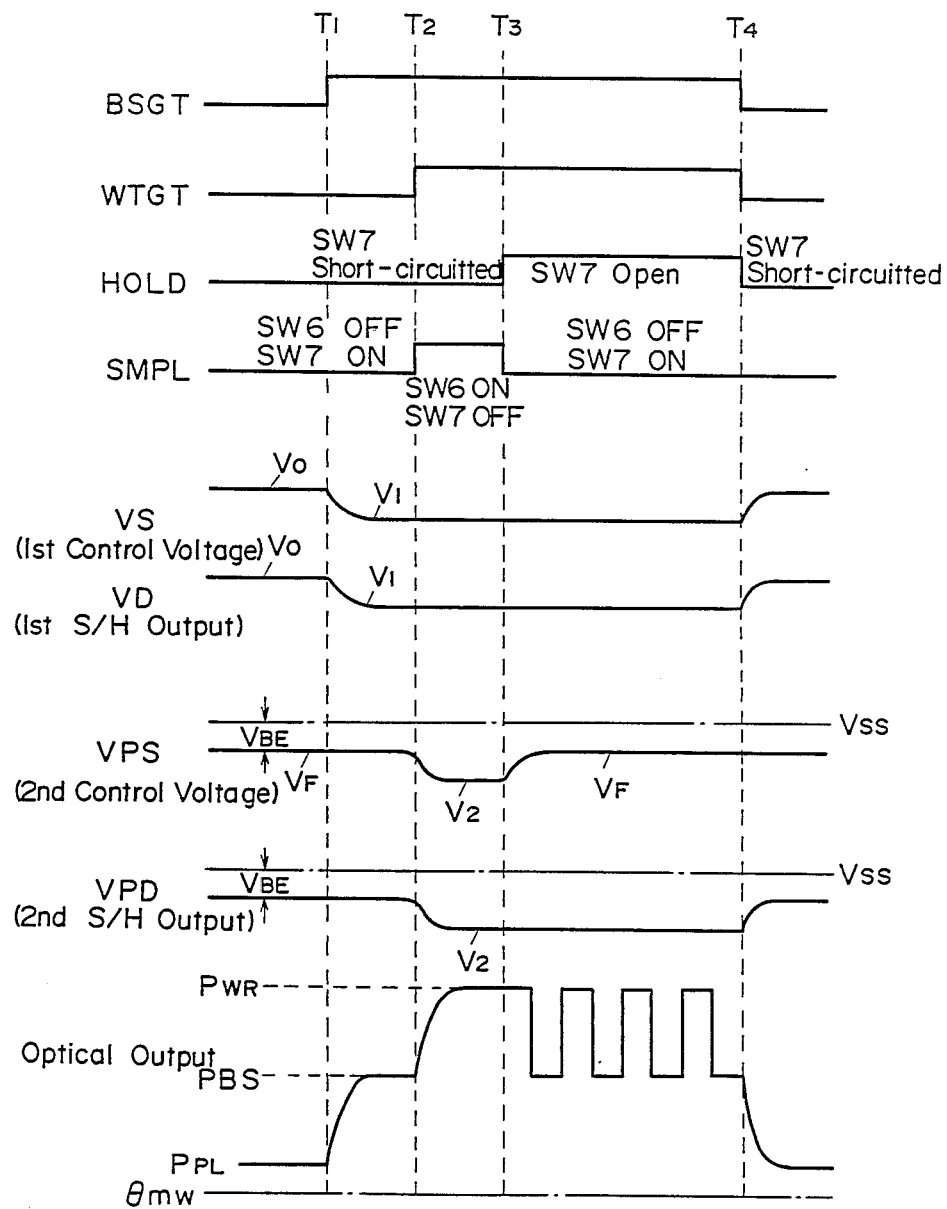
FIG. 8 is a waveform chart of the same embodiment.

FIG. 7 is a diagram showing the structure of the semiconducor laser control circuit according to the fourth embodiment of the present invention. FIG. 8 is a time chart for explaining the operations of the same circuit.

First of all, the portions added to and modified from the aforementioned circuit of the third embodiment of FIG. 5 will be described with reference to FIG. 7.

A bias gate BSGT 202 switches at the H level the reference voltage $V_{ref}$ from the playing reference voltage $V_{PL}$ to a biasing reference voltage $V_{BS}$ 201 to raise the optical output of the semiconductor laser to the bias level. A write gate WTGT 200 takes the H level, when the optical output of the semiconductor laser is dropped to the bias power $P_{BS}$ by the closed-loop control to open a switch SW3 112a thereby to hold the first control voltage $V_S$ of the first servo-amplifier 110. On the other hand, the write gate WTGT controls the switches SW4 and SW5 to prevent the first control voltage $V_S$ or the output of the first servo-amplifier 110 from being saturated during the holding section.

A sample gate SMPL 218 causes a second servo-amplifier 217 to act as a closed-loop control amplifier during a section after the write gate WTGT takes the H level and before a hold signal HOLD 214 takes the H level. Outside of this section, the sample gate SMPL 218 controls the opening and closing operations of switches SW6 203 and SW7 204 to prevent the second control voltage $V_{PS}$ of the output of the second servo-amplifier 217.

A voltage $V_{WR}$ 209 designates a reference voltage for setting the optical output of the semiconductor laser at the write power $P_{WR}$.

Four resistors $R_{i1}$ 205, $R_{i2}$ 206, $R_{F1}$ 218 and $R_{F2}$ 207 are connected with the second servo-amplifier 217 to cause this amplifier 217 to act as a differential amplifier. The relation among these four resistors is set at $R_{F1}/F_{i1}=R_{F2}/R_{i2}$ so that the positive input $V_M$ and negative input $V_{WR}$ of the second servo-amplifier may take an equal gain. Then, the second servo-amplifier takes an output $V_{PS}$ 213 expressed in the formula of $V_{PS}=(R_{F1}/R_{i1})(V_M-V_{WR})+V_F$ by using a voltage $V_F$ 210 which is dropped from the power source voltage by the forward voltage of one diode 211.

Here, the voltage $V_F$ is a control voltage for defining a limit, at which no current flows through a transistor 216 of the current source, and takes a value which is a subtraction of a base-emitter voltage VBE from the power source voltage.

Here, since the switch SW6 is opened whereas the switch SW7 is closed until the write gate WTGT is begun and since the second servo-amplifier 217 has its inputs fed equally with the reference voltage $V_{WR}$. The second servo-amplifier 217 takes the output $V_{PS}$ expressed in the form of $V_{PS}=(R_{F1}/R_{i1}-V_{WR})+V_F=V_F$ so that it is not saturated with the power source voltage but stands by.

A signal HOLD 214 is a hold signal for controlling a second sample hold circuit 212 and holds the control voltage $V_{PS}$ of the second servo-amplifier 217 when the optical output of the semiconductor laser is stabilized at the write power $P_{WR}$ by the closed-loop control.

The second sample hold circuit is composed of a switch SW7 212a for controlling a servo-loop, a capacitor 212b for holding the second control voltage $V_{PS}$, and a buffer amplifier 212c.

A control voltage $V_{PD}$ 215 of the second sample hold circuit 212 drives the transistor 216 to feed the semiconductor laser with an electric current.

The transistors 114 and 115 subjects write data WTDT 8 to optical pulse modulations between the bias power $P_{BS}$ of the closed-loop controlled optical power and the write power $P_{WR}$.

Next, the operations of the circuit of FIG. 7 will be described in the following with reference to FIG. 8.

When the bias gate BSTG comes into the bias status at the timing $T_1$ and at the H level, the optical output of the semiconductor laser has its reference voltage $V_{ref}$ 109 switched from $V_{PL}$ (for the playing operations) to $V_{BS}$ (for the biasing operations) while being under the closed-loop control.

The aforementioned first servo-amplifier 110 subjects the first control voltage $V_S$ to the closed-loop control so that the monitor voltage $V_M$ may be equal to the value $V_{BS}$ of the reference voltage $V_{ref}$ at its one input, thus raising the optical output of the semiconductor laser from the play power $P_{PL}$ to the bias power $P_{BS}$.

The first control voltage $V_S$ is varied from the play value $V_0$ to the bias value $V_1$, which is held at the timing $T_2$.

Since, on the other hand, the switch SW6 is opened whereas the switch SW7 is closed until the write gate WTGT begins, the second control voltage $V_{PS}$ of the output of the second servo-amplifier 217 is fed equally with the reference voltage $V_{WR}$ at its inputs to generate the aforementioned voltage $V_F$ as the value of the output control voltage so that it is not saturated with a power source voltage $V_{SS}$ but stands by without feeding the second current source with any current.

Here, when the write gate WTGT takes the H level, the switch SW6 is closed whereas the switch SW7 is opened. Then, the second servo-amplifier 217 subjects the second control voltage $V_{PS}$ to the closed-loop control so that the monitor voltage $V_M$ may be equal to the reference voltage $V_{MR}$ at its one input, thus raising the optical output of the semiconductor laser from the bias power $P_{BS}$ to the write power $P_{WR}$.

The second control voltage $V_{PS}$ of the second servo-amplifier 217 varies fast from the unsaturated level $V_F$, which is taken until the write gate WTGT takes the H level, to the write level $V_2$ until it is held at the timing $T_3$ by the hold signal HOLD. Simultaneously with this, the switch SW6 is opened whereas the switch SW7 is closed so that the second servo-amplifier 217 has its input shorted to generate the aforementioned voltage $V_F$ at its output and comes into its stand-by state.

When the hold section is terminated at a timing $T_4$, the aforementioned first servo-amplifier 110 restores its closed-loop control so that the optical output of the semiconductor laser is switched from the write power $P_{WR}$ to the play power $P_{PL}$.

Since, at this time, the first control voltage $V_S$ or the output of the first servo-amplifier 110 is at the same level as the value $V_1$ of the output $V_D$ of the sample hold circuit 112, it is smoothly connected so that the optical output of the semiconductor laser is switched fast and stably from the write power $P_{WR}$ to the play power $P_{PL}$.

As has been described hereinbefore, according to the present embodiment, by the actions of both: the switch means for opening or substantially opening the input of the second servo-amplifier and the monitor voltage generating means during the second hold section and until the second sample section of the closed loop control begins; and the switch means for shorting or substantially shorting the monitor voltage generating means of the input of the second servo-amplifier and the second reference voltage generating means, the second control means generated by the second servo-amplifier is not saturated but held at the voltage level feeding no electric current to the second current source. As a result, when the second sample section begins, the second control voltage can vary fast to raise the optical output of the semiconductor laser fast and stably from the bias power to the write power.

As has been described hereinbefore, according to the present invention, at the timing of switching the control of the optical output of the semiconductor laser to the closed-loop control, the optical output of the semiconductor laser can be switched fast and stably from the high to low powers or vice versa.

At the transition to the closed-loop control, moreover, the optical output of the semiconductor laser can be prevented from generating an abnormal power to shorten the lifetime of the semiconductor itself or the material of the optical disc. Thus, the present invention can enjoy a high effect in practical use.

Figure 9:
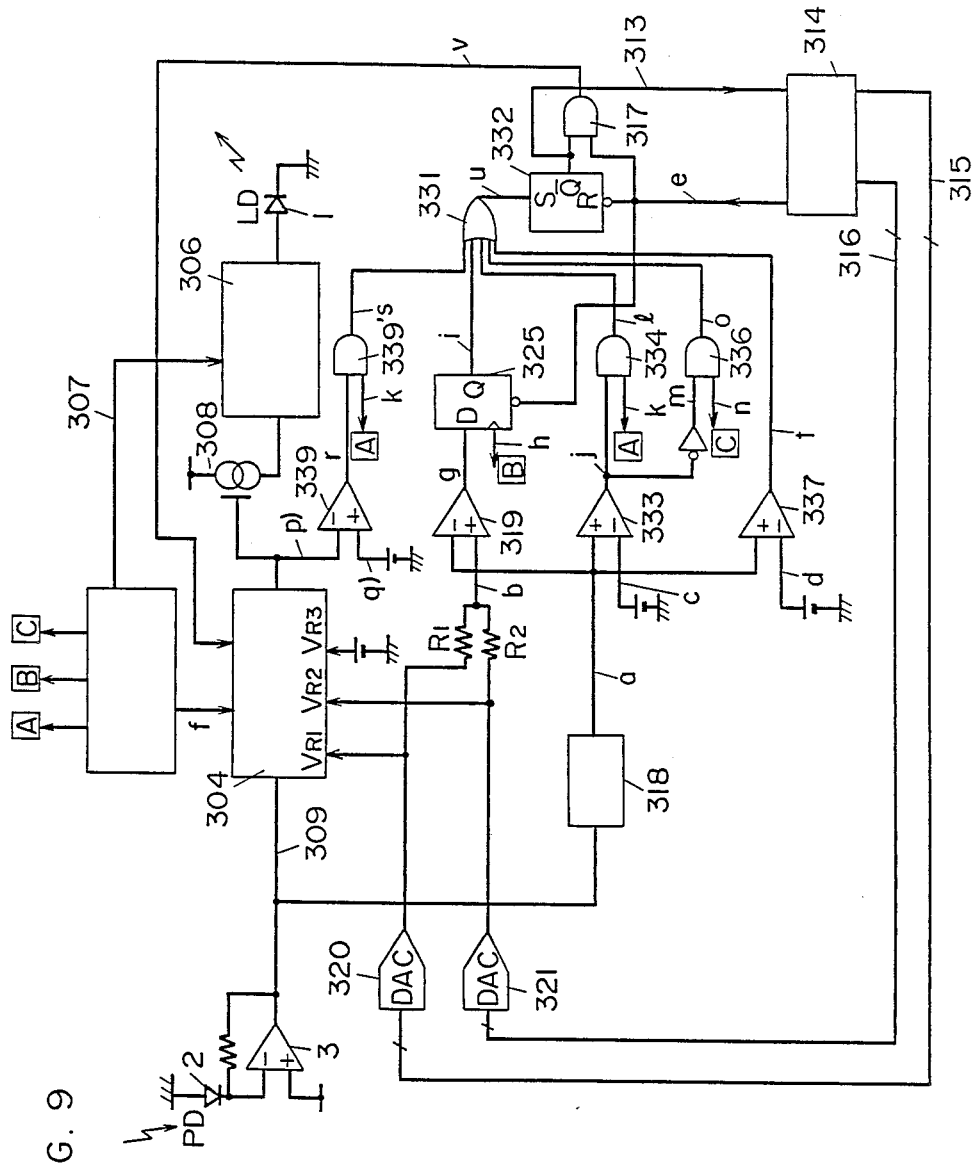
FIG. 9 is a block diagram showing the semiconductor laser control circuit according to a fifth embodiment of the present invention.
Figure 11:
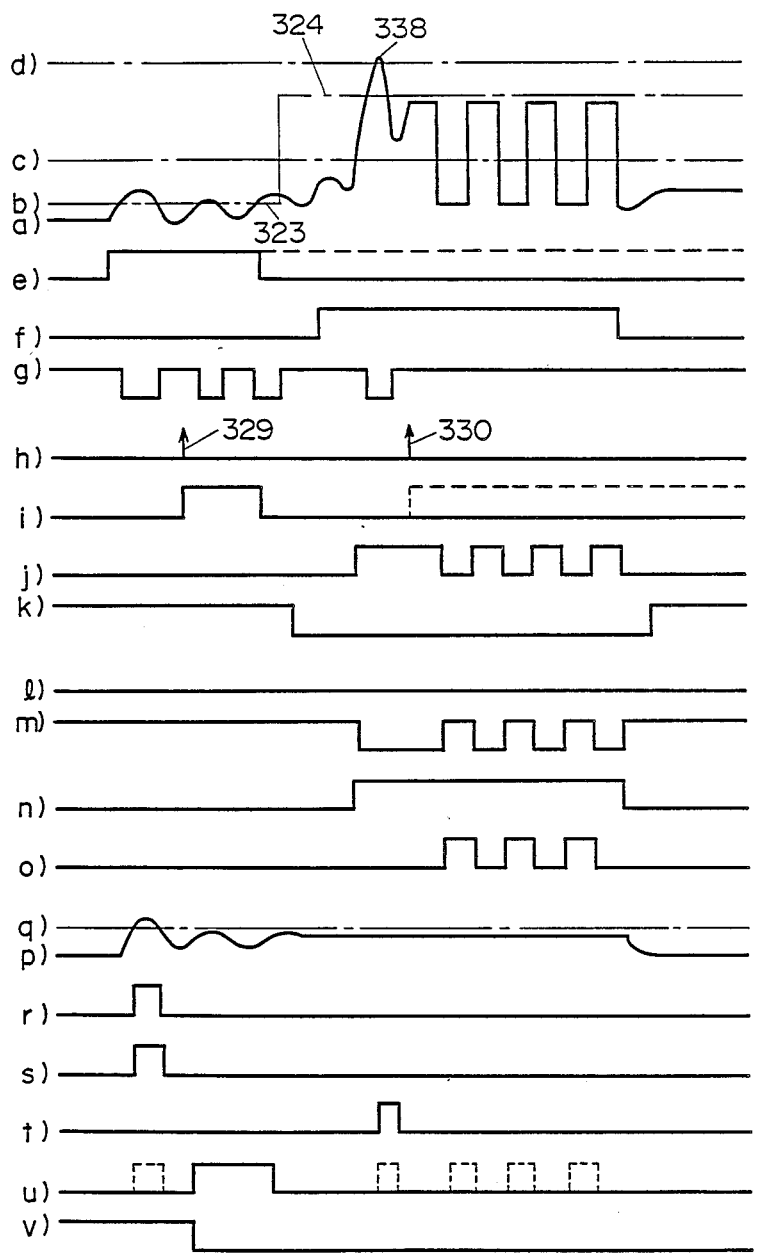
FIG. 11 is a waveform chart of the same embodiment when in an abnormal emission.
Figure 12:
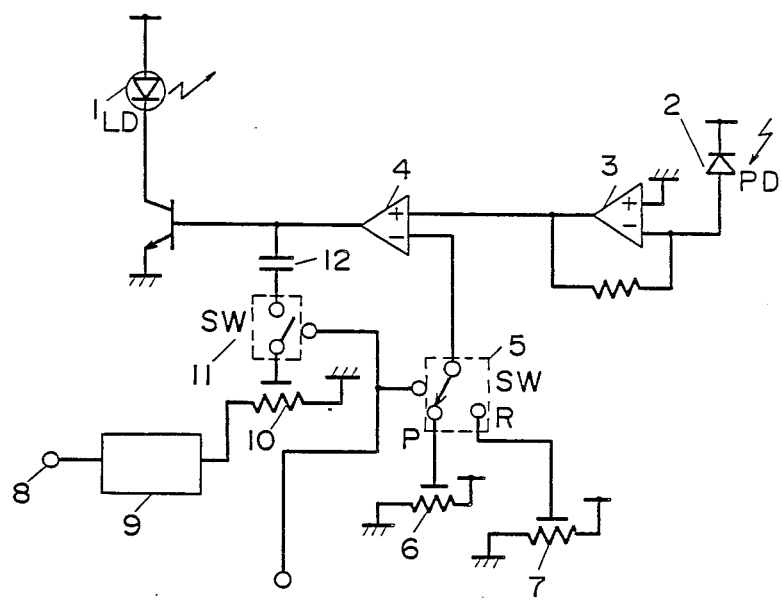
FIG. 12 is a diagram showing the structure of the semiconductor laser control circuit according to the prior art.
Figure 13:
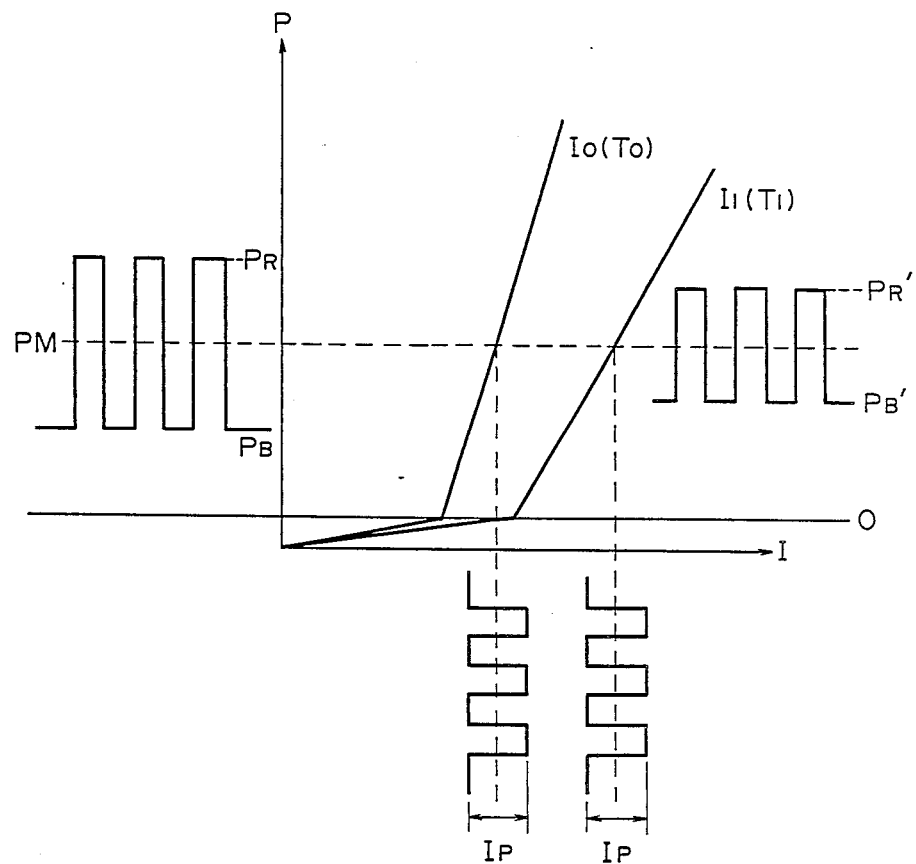
FIG. 13 is a waveform chart showing the optical output of the semiconductor laser control circuit of the prior art.

FIG. 9 is a diagram showing the structure of the semiconductor laser control circuit according to a fifth embodiment of the present invention. The output light of the semiconductor laser 1 is received by the optical detector 2 and is subjected to a current-voltage conversion by the operation amplifier 3 to generate an optical power control error voltage 309, which is fed to an optical power control unit 304. This optical power control unit 304 drives a current source in the DC emission mode in accordance with a reference voltage $V_{R3}$ for setting a third optical power value, to control the optical power value of the semiconductor laser 1. In the pulse modulation mode, the control unit 304 controls the optical power in accordance with a first reference voltage $V_{R1}$ for setting the optical power value at the peak value having an optical pulse waveform and a second reference voltage $V_{R2}$ for setting the optical value at the bottom value. An optical pulse modulator 306 subjects a control value between the bottom and peak values to a pulse modulation in response to a modulation signal 307. An emission control unit 314 feeds DA converters 320 and 321 with a first data signal 315 corresponding to the first reference voltage for setting the power value of the optical pulse and a second data signal 316 corresponding to the second reference voltage, to generate first and second reference voltages. These two reference voltages can be arbitrarily set in accordance with the data value of the data signal fed from the emission control unit. In the pulse modulation mode, the optical disc is written and erased to make it necessary to vary the optical power levels at the peak and bottom values of the pulse waveforms in accordance with the radial position and writing material of the optical disc. FIGS. 11 a to v illustrate the signals at the individual units of the structure in the signal waveforms. The emission control unit 314 generates a emission control signal to generate a trouble detection signal 313 and an AND output, which are fed to the optical power control unit to turn on and off the output light of the semiconductor laser. The optical control error voltage 309 is fed to a filter circuit 318, the output a of which is used as the optical power monitor signal to detect the emission status. The filter circuit 318 is provided to eliminate the noises such as self-feedback noises generated by the semiconductor laser itself thereby to prevent the erroneous operations of the trouble detecting circuit. First of all, the operations of a comparator 319 will be described in the following. The comparator 319 is fed with the optical power monitor signal a and a comparison voltage b to compare them thereby to produce a comparison output g. The comparison voltage b is a resistive addition of the first and second reference voltages. In the present embodiment, resistances $R_1$ and $R_2$ are so equalized that the average value of the first and second reference voltages may take the comparison voltage b. By varying the values $R_1$ and $R_2$, the first and second reference voltages may be arbitrarily arithmetically processed to set the comparison voltage b.

Figure 10:
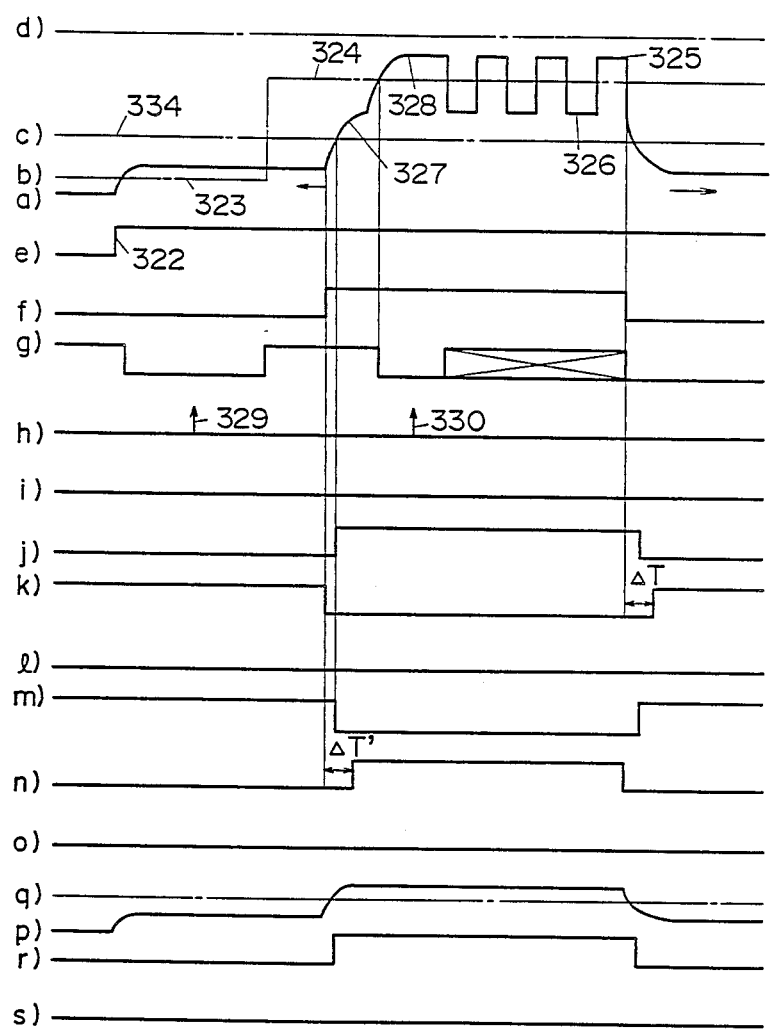
FIG. 10 is a waveform chart of the same embodiment.

In the DC emission mode, the DC emission is controlled to the first optical power value set at the third reference voltage $V_{R3}$ if the emission control signal e is set in the state of the emission ON. At this time, the data signal 315 is sent out to equalize the first reference voltage to the third reference voltage to send out the data signal 316 at such a value that the second reference voltage may take a zero optical power. As a result, the reference voltage b takes a half value 323 of the third reference voltage. If the optical power monitor signal a is equal to or higher than the comparison voltage 323, the output g of the comparator 319 takes the low level. It is, therefore, possible to detect that the DC emission status is at a normal level. Immediately after the emission control signal e is on, the transitional response time for the optical power control makes it necessary to delay the timing for checking the emission status so as to accomplish an accurate and stable detection. Numeral h designates an emission check timing which is generated (at 329) at the instant when the DC emission control is sufficiently stabilized. The DC emission check timing 329 is inputted to the clock of the D flip-flop to latch and output the output signal g of the comparator 319. FIG. 11 is a waveform chart showing the signals at the individual units when the optical power is abnormally generated. If the DC emission level oscillates, as indicated at (a) in FIG. 11, the comparator output of (g) of FIG. 11 does not take the low level. If the output signal is latched at the DC emission check timing 329, the trouble detection sign (i) of FIG. 11 is outputted at the high level. In normal operations, the status of the low level is maintained, as indicated at (i) in FIG. 10, so that no trouble is detected.

In the pulse modulation mode, the first reference voltage $V_{R1}$ is set at a peak value 325 whereas the second reference voltage $V_{R2}$ is set at a bottom value 326 by sending out the data signals 315 and 316 from the emission control unit 314. As a result, the comparison voltage b at this time takes the average value of the peak and bottom values, as indicated at 324. In the pulse modulation mode, there are provided, as disclosed in Japanese Patent Application No. 62-264461, a bottom power sample control section 327 for controls to the optical power at the bottom value of the pulse waveform and a peak power sample control for controls to the optical power at the peak value. It is reliably detected at a peak power emission check timing 330 that the peak power value is equal to or higher than the normal level. The check timing 330 falls at the rear half of the peak power sample control section 328 and when the peak power value is stabilized after lapse of the transitional response time of the peak power control. At this peak power emission check timing 330, the output signal g of the comparator 319 is latched and outputted by the D flip-flop 325. If the optical power monitor signal a is equal to or higher than the comparison voltage value 324 at the peak power emission check timing 330, the output signal of the comparator 319 takes the low level so that the latch output is not at the high level. If an abnormal emission takes place so that the optical power monitor signal level is equal to or lower than the comparison voltage level 324, as indicated at (i) in FIG. 10 and at (a) in FIG. 11, the latch output takes the high level so that a trouble is detected, as indicated at (i) in FIG. 11. The latch output i is subjected together with other trouble detecting signals to an OR input 331 to set an R-S flip-flop 332. If a trouble is caused to set the R-S flip-flop, the $\overline{Q}$ takes the low level so that an emission control signal v to be inputted to the optical power control unit 304 is turned off by the AND gate 317, as indicated at (v) in FIG. 11. This $\overline{Q}$ output is informed as the trouble detecting signal 313 to the emission control unit 314 to intentionally turn off the emission control signal e. Simultaneously with this, the R-S flip-flop 332 is reset to release the latch of the abnormal status.

Thus, the influences of the transitional response generated at the timing of switching the power control and the optical power monitor signal are pulse-modulated by generating the comparison voltage by the use of the reference voltage value for the power setting during the DC emission and the pulse modulations and by latching the comparison output to detect the trouble only at the timing having the stabilized optical power control. As a result, the highly reliable trouble detection can be accomplished while preventing the erroneous detections of the peak and bottom values of the pulse waveform.

Next, the operations of a comparator 333 will be described in the following. In the present embodiment, the comparator 333 has its comparison voltage c set at a fixed voltage value 334 between the second reference voltage or the DC emission level and the second reference voltage or the bottom value of the pulse waveform, as indicated at c in FIG. 11. Like the comparison voltage b, moreover, the second reference voltage and the third reference voltage can be resistively added and generated. It is confirmed in the DC emission that the DC emission power is lower than an intermediate value between the bottom value of the pulse waveform and the DC emission level, and it is also confirmed in the pulse modulations that the bottom value of the pulse waveform is higher than that intermediate value. Incidentally, a detection section is specified in each mode to provide a window so as to prevent the erroneous operations due to the transitional response of the optical power control at the timing of switching the DC emission and the pulse modulations. Thus, the optical write/play apparatus can be prevented from the written content of the optical disc from being erroneously written and erased during the play by taking the optical power in the vicinity of the bottom value of the pulse waveform. For the writing operations, the writing and erasing operations can be made highly reliable by checking the emission level failing to reach the necessary level. The output signal of the comparator 333 has its rising and breaking edges delayed more than those of the emission mode switching signal f, as indicated at (j) in FIG. 10. This is because there is a time period for the transitional response of the optical power control level from the DC emission level to the level of the bottom value at the emission mode switching time. In order to eliminate this transitional response section, therefore, the output signal j of the comparator 333 is fed to the AND gate 334 only in the section, in which a detection section signal k takes the high level, in the DC emission mode. The breaking edge of the detection section signal k is produced simultaneously with the rising edge of an emission mode switching signal f, whereas the breaking edge of the detection section signal is produced with a delay of $\Delta T$ from the breaking edge of the emission mode switching signal f. The value of the delay $\Delta T$ is selected to take such a timing that the DC emission control may be sufficiently stabilized when at the switching from the pulse modulations to the DC emission and after lapse of the transitional response section. No trouble detection signal l is outputted, as indicated at (l) in FIG. 10, if no emission level equal to or higher than the comparison voltage c is generated at the DC emission, i.e., in the section in which the detection section signal k is at the high level.

In the pulse modulations, on the other hand, a signal m, which is inverted from the output signal j of the comparator 333, is fed to the AND gate 336 only in the section in which a detection section signal n takes the high level. The detection section signal n delays the rising edge by $\Delta T'$ excepting the transitional response time from the rising edge of the emission mode switching signal f and generates the breaking edge simultaneously with the breaking edge of the emission mode switching signal f. Thus, the bottom value lower than the comparison voltage c can be detected in the section in which the optical power control in the pulse modulations is sufficiently stabilized. Without the bottom value equal to or lower than the comparison voltage c, a trouble detection signal o is not outputted, as indicated at (o) in FIG. 11. If, on the contrary, the bottom value is equal to or lower than the comparison voltage in the pulse modulations, as indicated at (a) in FIG. 11, the trouble detection signal o is outputted at the high level in the section in which the detection section signal n is at the high level, as indicated at (o) in FIG. 11.

Thus, a highly reliable semiconductor laser control circuit is constructed by checking the level of the bottom value in the DC emission and in the pulse modulations excepting the section of the transitional response thereto to check the emission level at which the written content of the optical disc is erroneously written and erased or fails to reach the writing and erasing operations.

Next, the operations of a comparator 337 will be described in the following. A comparison voltage d is set in the vicinity of the maximum allowable optical output of the semiconductor laser 1 and is compared with the optical power monitor signal a, (as indicated at t). The detection does not provide any section irrespective of the emission mode to prevent the semiconductor laser from being broken by the emission of an excessive optical power. If an optical power exceeding the maximum allowable optical output is generated by the oscillations of the optical power control loop, as indicated at 338 of (a) in FIG. 11, a trouble detection signal t is outputted, as indicated at (t) in FIG. 11.

Finally, the operations of a comparator 339 will be described in the following. This comparator 339 compares a control voltage p for controlling the electric current flowing through the current source 108 and a comparison voltage q at a fixed value (as indicated at r in FIG. 11). The control voltage p is proportional to the value of the current flowing through the semiconductor laser 1. As a result, the control voltage p takes a signal waveform substantially proportional to the emission optical power, as indicated at (p) in FIG. 10. Here, the comparison voltage q is set at a voltage corresponding to the maximum drive current value necessary for the optical power value in the DC emission mode. This maximum drive current value necessary for the DC emission mode means the maximum value considering the temperature characteristics and aging of the semiconductor laser. If a trouble exceeding the DC emission power is detected with the current value corresponding to the low optical power level such as the DC emission level, the breakage of the semiconductor laser can be detected by the above-specified current value even if the signal from the optical detector is cut so that the optical power control runs away to produce an excessive power and the optical power monitor signal a is not generated. The output signal r of the comparator 339 likewise outputs the detection section signal k to an AND gate 339' to output a trouble detection signal s so as to eliminate the influences of the transitional response. This comparator 339' is different in its function from the other comparators such that it can prevent the breakage of the semiconductor laser even if the power monitor signal a is not generated.

As has been described hereinbefore, according to the present embodiment, the comparison voltage is generated by the use of the reference voltage value for power setting in the DC emission and in the pulse modulations so that the compared output is latched to detect the trouble only at the timing having the stabilized optical power control. Thus, a trouble detection can be accomplished highly reliably by preventing not only the influences of the transitional response generated at the switching of the power control but also the erroneous detection of the peak value of the pulse waveform due to the pulse modulations of the optical power monitor signal. Moreover, an intermediate value between the bottom value of the pulse waveform and the DC emission power is used as the comparison voltage to detect it during the section excepting the transitional response section in the mode switching that the comparison value is not exceeded in the DC emission but in the pulse modulations. Thus, it is possible to realize the optical power control of the semiconductor laser highly reliably by checking the emission level which causes the erroneous writing and erasure of the written content of the optical disc and the failure to reach the writing and erasing operations. By detecting the excessive current value in the DC emission mode, moreover, it is possible to prevent the emission with an excessive power to break the semiconductor laser even if the monitor signal from the optical detector is cut.

As has been described hereinbefore, according to the present invention, the check of the emission level of the peak value of the pulse waveform is compared by processing the reference voltage for actually setting the optical output so that it can be accomplished with a higher reliability than that obtained merely by making a comparison with the fixed voltage. Moreover, the erroneous detection can be detected by accomplish the checking with a predetermined timing within the sample control section in which the pulse modulations are not begun yet. Still moreover, the checking of the emission level at the bottom value can be accomplished highly reliably by setting the comparison voltage at a voltage value between the DC emission level and the bottom value and by limiting the check section to that excepting the transitional section of the optical power control in the mode switching operation. In the DC emission mode, the comparison is made with the voltage value between the bottom value and the DC emission level and with the maximum value of the current flowing in the DC emission. Thus, it is possible to prevent not only such an abnormal emission as will erroneously write and erase the written content of the optical disc but also the breakage of the semiconductor laser reliably.

While the specific embodiments of the present invention have been illustrated and described herein, it is realized that other modifications and changes will occur to those skilled in the art. It is, therefore, to be understood that the appended claims are intended to cover all modifications and changes as fall within the true spirit and scope of the invention.

What is claimed is:

1. A semiconductor laser control circuit comprising: optical power control error voltage generating means made receptive of the output light of a semiconductor laser through an optical detector for generating an optical power control error voltage; first reference voltage generating means for generating a first reference voltage for setting the output light of said semiconductor laser at a first optical power value; first closed loop control means for controlling the output light of said semiconductor laser to said first light power value by varying an electric current flowing through said semiconductor laser with a first control voltage which is obtained by comparing said optical power control error voltage and said first reference voltage; first sample hold means for holding the first control voltage value at the instant when the optical power control by said first closed loop control means is stabilized, to output said first hold voltage; first open loop control means for controlling the output light of said semiconductor laser to said first optical power value by varying an electric current flowing through said semiconductor laser with said first hold voltage; second reference voltage generating means for generating a second reference voltage for setting the output voltage of said semiconductor laser at a second optical power value; second closed loop control means for controlling the output light of said semiconductor laser to said second light power value by varying an electric current flowing through said semiconductor laser with a second control voltage which is obtained by comparing said optical power control error voltage and said second reference voltage; second sample hold means for holding the second control voltage value at the instant when the optical power control by said second closed loop control means is stabilized, to output a second hold voltage; second open loop control means for controlling the output light of said semiconductor laser to said second optical power value by varying an electric current flowing through said semiconductor laser with said second hold voltage; and optical pulse modulating means for optical pulse modulations of said first optical power value, which is controlled by said first open loop control means, to a bottom value having an optical pulse waveform and said second optical power value, which is controlled by said second open loop control means, to a peak value having an optical pulse waveform.

2. A semiconductor laser control circuit comprising: optical power control error voltage generating means made receptive of the output light of a semiconductor laser for converting it into an optical power; first reference voltage generating means for setting the output light of said semiconductor laser at a first level; a first servo-amplifier made receptive of said optical power control error voltage and a first reference voltage for generating a first control voltage by comparing and outputting the difference inbetween; a first current source for feeding an electric current to said semiconductor laser in accordance with the first control voltage of said first servo-amplifier; first sample hold means connected between said first servo-amplifier and said first current source for closed loop control of the output light of said semiconductor laser to a first level with the control voltage of said first servo-amplifier during a first sample section and for holding the control voltage of said first servo-amplifier during a first hold section to open-loop control the output light of said semiconductor laser to said first level; second reference voltage generating means for setting the output light of said semiconductor laser at a second level; a second servo-amplifier made receptive of said monitor voltage and a second reference voltage for generating a second control voltage by comparing and outputting the difference inbetween; a second current source for feeding an electric current to said semiconductor laser in accordance with the second control voltage of said second servo-amplifier; second sample hold means connected between said second servo-amplifier and said second current source for closed control of the output light of said semiconductor laser to a second level with the control voltage of said second servo-amplifier during a second sample section from the beginning of said first hold section to the beginning of a second hold section and for holding the control voltage of said second servo-amplifier during said second hold section to open-loop control the output light of said semiconductor laser to said second level; optical pulse modulating means for optical pulse modulations between the first and second levels of said open-loop controlled optical output; third switch means for keeping the input of said second servo-amplifier and said monitor voltage generating means open or substantially open during said second hold section and until the second sample section of said closed-loop control begins; and fourth switch means for shorting or substantially shorting the two inputs of said second servo-amplifier, whereby the second control voltage generated by said second servo-amplifier is prevented from being saturated during said second hold section and until the second sample section of said closed-loop control begins.

3. A semiconductor laser control circuit according to claim 2, further comprising feedback means for feeding back the output of said sample hold means to the inputs of said servo-amplifiers through a resistor to substantially equalize the control voltages, which are generated by said servo-amplifiers, to the voltages, which are held by said sample hold means, during said hold section or until the sample section of said closed-loop control begins.

4. A semiconductor laser control circuit according to claim 2, further comprising voltage applying means for applying such a third control voltage to the input of said second servo-amplifier that said second servo-amplifier may output said second control voltage for rendering said second servo-amplifier unsaturated and said second current source inoperative, whereby said second control voltage is neither saturated nor does feed said second current source any electric current during said second hold section and until said second sample section begins.

5. A semiconductor laser control circuit comprising: optical power control error voltage generating means made receptive of the output light of a semiconductor laser through an optical detector for generating an optical power control error voltage; first reference voltage generating means for generating a first reference voltage for setting the output light of said semiconductor laser at a first optical power value; first closed loop control means for controlling the output light of said semiconductor laser to said first light power value by varying an electric current flowing through said semiconductor laser with a first control voltage which is obtained by comparing said optical power control error voltage and said first reference voltage; first sample hold means for holding the first control voltage value at the instant when the optical power control by said first closed loop control means is stabilized, to output said first hold voltage; first open loop control means for controlling the output light of said semiconductor laser to said first optical power value by varying an electric current flowing through said semiconductor laser with said first hold voltage; second reference voltage generating means for generating a second reference voltage for setting the output voltage of said semiconductor laser at a second optical power value; second closed loop control means for controlling the output light of said semiconductor laser to said second light power value by varying an electric current flowing through said semiconductor laser with a second control voltage which is obtained by comparing said optical power control error voltage and said second reference voltage; second sample hold means for holding the second control voltage value at the instant when the optical power control by said second closed loop control means is stabilized, to output a second hold voltage; second open loop control means for controlling the output light of said semiconductor laser to said second optical power value by varying an electric current flowing through said semiconductor laser with said second hold voltage; third reference voltage generating means for generating a third reference voltage for setting the output light of said semiconductor laser at a third optical power value; third closed-loop control means for controlling the output light of said semiconductor laser to a third optical power value by varying an electric current flowing through said semiconductor laser with a third control voltage obtained by comparing said optical power control error voltage and said third reference voltage; and optical pulse modulating means for optical pulse modulations of said first optical power value, which is controlled by said first open loop control means, to a bottom value having an optical pulse waveform and said second optical power value, which is controlled by said second open loop control means, to a peak value having an optical pulse waveform.

6. A semiconductor laser control circuit according to claim 5, further comprising: emission mode switching means for switching the output light of said semiconductor laser between a pulse modulation mode and a DC emission mode, in which a DC emission is accomplished at said third optical power value having no pulse modulation; and emission mode detecting means for detecting that the output light of said semiconductor laser is at a normal emission level or at an abnormal emission level in said two emission modes.

7. A semiconductor laser control circuit according to claim 6, further comprising means for detecting that the peak value having an optical pulse waveform is higher or lower than a predetermined optical power level in said pulse modulation mode, by comparing an optical power monitor voltage and a predetermined comparison voltage.

8. A semiconductor laser control circuit according to claim 6, further comprising means for detecting that the bottom value having an optical pulse waveform is higher or lower than a predetermined optical power level in said pulse modulation mode, by comparing an optical power monitor voltage and a predetermined comparison voltage.

9. A semiconductor laser control circuit according to claim 6, further comprising means for detecting that the DC emission level is higher or lower than a predetermined optical power level in said DC emission mode, by comparing an optical power monitor voltage and a predetermined comparison voltage.

10. A semiconductor laser control circuit according to claim 6, further comprising means for detecting that the optical output level is higher or lower than a level, which is set in the vicinity of the maximum allowable optical output of said semiconductor laser in said pulse modulation mode and/or said DC emission mode, by comparing an optical power monitor voltage and a predetermined comparison voltage.

11. A semiconductor laser control circuit according to claim 6, further comprising means for detecting that the optical output level is higher or lower than a level, which is set in the vicinity of the maximum allowable optical output of said semiconductor laser in said pulse modulation mode and/or said DC emission mode, by comparing an electric current value flowing through said semiconductor laser and a predetermined comparison voltage.

12. A semiconductor laser control circuit according to any of the claims 7, 8, 9 and 10, wherein said predetermined comparison voltage is generated by arithmetically processing said first, second and/or third reference voltages.

13. A semiconductor laser control circuit according to claim 7 or 8, wherein said predetermined comparison voltage takes a voltage value between said first and second reference voltages.

14. A semiconductor laser control circuit according to claim 8 or 9, wherein said predetermined comparison voltage takes a voltage value between said second and third reference voltages.

15. A semiconductor laser control circuit according to claim 9, wherein said predetermined comparison voltage takes a voltage value between said third reference voltage and a fourth reference voltage at which the optical output of said semiconductor laser takes a zero level.

16. A semiconductor laser control circuit according to any of the claims 7, 8, 9 and 10, wherein the emission state is detected by inputting an optical power minitor voltage to an integrating or detecting circuit having a predetermined time constant to compare the output of said integrating or detecting circuit with a predetermined comparison voltage.

17. A semiconductor laser control circuit according to claim 7 or 8, wherein there is provided a sample control section in which the output light of said semiconductor circuit is controlled by said first or second optical power control means to either the first optical power voltage taking the peak value of the pulse waveform or the second optical power value taking the bottom value of the pulse waveform in said pulse modulation status, so that the emission state may be detected by comparing said optical power monitor voltage and said predetermined comparison voltage at a predetermined timing during said control section.

18. A semiconductor laser control circuit according to claim 9, wherein the detection of said emission status is accomplished at a predetermined timing after lapse of a constant time after said semiconductor laser has been switched from a non-emission status to said DC emission status.

19. A semiconductor laser control circuit according to claim 9, wherein the detection of said emission mode is accomplished during said DC emission mode section excepting either a transitional status for switching from said DC emission mode to said pulse modulation mode or a transitional status for switching from said pulse modulation mode to said DC emission mode.

20. A semiconductor laser control circuit according to claim 7 or 8, wherein the detection of said emission mode is accomplished during said DC emission mode section excepting either a transitional status for switching from said DC emission mode to said pulse modulation mode or a transitional status for switching from said pulse modulation mode to said D emission mode.

21. A semiconductor laser control circuit according to claim 6, further comprising means for comparing and detecting the value of an electric current flowing through said semiconductor laser, which is controlled by said third optical power control means during said DC emission mode excepting either a transitional status for switching from said DC emission mode to said pulse modulation mode or a transitional mode for switching from said pulse modulation mode to said DC emission mode, and a predetermined comparison current value.

22. A semiconductor laser control circuit according to claim 6, further comprising protection means for controlling said semiconductor laser from an emission status to a non-emission status when it detects said abnormal emission level.

* * * * *